(12) United States Patent
Munnig Schmidt

(10) Patent No.: US 7,006,199 B2
(45) Date of Patent: Feb. 28, 2006

(54) LITHOGRAPHIC POSITIONING DEVICE AND DEVICE MANUFACTURING METHOD

(75) Inventor: Robert-Han Munnig Schmidt, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 65 days.

(21) Appl. No.: 10/796,289

(22) Filed: Mar. 10, 2004

(65) Prior Publication Data

US 2005/0200826 A1    Sep. 15, 2005

(51) Int. Cl.
*G03B 27/58* (2006.01)
*G03B 27/62* (2006.01)

(52) U.S. Cl. .......................................... 355/72; 355/75
(58) Field of Classification Search ................. 355/53, 355/72–76; 310/10, 12, 13; 378/34, 35; 318/135, 625, 632
See application file for complete search history.

(56) References Cited

U.S. PATENT DOCUMENTS

| | | | |
|---|---|---|---|
| 5,767,948 A | 6/1998 | Loopstra et al. | |
| 6,054,784 A * | 4/2000 | Sperling et al. | 310/12 |
| 6,124,923 A * | 9/2000 | Horikawa | 355/53 |
| 6,259,174 B1 * | 7/2001 | Ono | 310/13 |
| 6,891,599 B1 * | 5/2005 | Iwamoto | 355/72 |

* cited by examiner

*Primary Examiner*—Henry Hung Nguyen
(74) *Attorney, Agent, or Firm*—Pillsbury Winthrop Shaw Pittman LLP

(57) ABSTRACT

A positioning device for positioning an object inside a lithographic apparatus is described. The positioning device includes a first drive unit and a second drive unit for positioning the object. The first drive unit has a first part connected to the object and a second part connected to a first part of the second drive unit. The positioning device further includes a permanent magnet system constructed and arranged to provide at least part of the force for accelerating or decelerating the object.

29 Claims, 9 Drawing Sheets

LITHOGRAPHIC POSITIONING DEVICE AND DEVICE MANUFACTURING METHOD

BACKGROUND OF THE INVENTION

1. Field of the Invention

The present invention relates to a lithographic apparatus a, in particular, a lithographic positioning device for positioning an object and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In order to project the pattern onto the appropriate portion of the substrate, both short stroke accurate positioning and large stroke displacements of the object table are generally applied. In general, the object table, holder, or stage provided with the patterning device requires large displacements in only one direction while the table, holder, or stage provided with the substrate usually requires large displacements in a plane.

Usually, the object table provided with the patterning device or the substrate is connected to a first drive unit comprising a plurality of actuators or linear motors. These actuators or motors allow accurate displacement of the object over a small range (~1 mm). In many applications, these actuators or linear motors are contactless electromagnetic actuators or motors. The first drive unit is usually mounted on a second drive unit that allows large displacements in at least one direction. This second drive unit may, as an example, comprise of a linear motor or a planar motor.

In such an arrangement, both the first and second drive units have to be energized in order to displace the object table. To illustrate how this is typically accomplished, consider the following conventional drive arrangement.

A first drive unit contains a plurality of electromagnetic actuators, each actuator comprising a first part connected to the object table and a second part that is mounted on a second drive unit. The second drive unit is constructed to displace the first drive unit (together with the object table) in a first horizontal direction (Y-direction), that corresponds to the scanning direction in this example. One of the electromagnetic actuators can generate a force in the Y-direction. The stroke of the electromagnetic actuators of the first drive is limited to only a few mm while the second drive unit enables displacements of ~0.5 m.

Such an arrangement could be applied in a so-called scanner to position the patterning device relative to the projection system. The scanning operation requires that the patterning device, mounted to the object table, is displaced along the Y-direction. This displacement process can be approximated by three different phases: an acceleration phase, a constant velocity phase and a deceleration phase.

During the first and third phase, both the first drive unit and the second drive unit have to be powered in order accelerate or decelerate the object table in the Y-direction. This is due to the fact that the object table is not rigidly attached to the second drive unit but is positioned relative to the second drive unit by means of the contactless actuators of the first drive unit. Therefore, the first drive unit has to be designed in such a manner that the generated force is sufficient to accelerate the object table with the first parts of the different electromagnetic actuators attached to it. Typical values of the required force in the scanning direction for the first drive unit may be >200 N. Generating this force may result in a significant amount of dissipation in the current carrying coils of the electromagnetic actuators.

During the second phase of the displacement process i.e. the constant velocity phase, the main objective is the accurate positioning of the object table. In a lithographic apparatus, this phase corresponds to the exposure phase during which the pattern on the patterning device is projected onto the substrate. The patterning device and the substrate have to move synchronously with a nanometer accuracy, in order to project the pattern on the appropriate part of the substrate. In order to meet this accuracy, the requirements of the actuators of the first drive unit are severe with respect to stiffness, dynamic response, damping, etc.

SUMMARY OF THE INVENTION

Known lithographic positioning devices, having the arrangements described above, are disclosed in U.S. Pat. No. 5,767,948. This patent describes a lithographic apparatus that includes a positioning device for displacing and positioning a stage of the lithographic apparatus. The positioning device comprises linear motors for positioning an object that is mounted on the stage by a first drive unit over comparatively small distances with a high accuracy, the first drive unit can be positioned in at least one direction by a second drive unit over comparatively large distances with a limited accuracy characteristic.

However, because of the different operating conditions and the different requirements during the different phases described above, the design of the first drive unit requires a give and take to combine the force requirements, during acceleration and deceleration, with the accuracy requirements, during the constant velocity phase. This results in a non-optimal performance of the first drive unit.

Moreover, the force requirements necessary to obtain the appropriate acceleration and deceleration, in combination with the allowable amount of dissipation, will determine the required overall size of the drive unit. During the constant velocity phase however, the drive unit can be considered oversized because the force requirements are much less during that phase. This oversized drive unit may not have an optimal dynamic response during the constant velocity phase. Since part of the weight of the drive unit has to be displaced as well, the overall weight to be accurately positioned can be significantly higher than the sole weight of the object table, requiring additional control effort. The different force requirement during acceleration (or deceleration) and during the constant velocity phase also hinder an optimal design for the amplifier (e.g. a current amplifier) that provides the power to the different actuators. In order to provide the appropriate acceleration, the amplifier has to supply, as an example, a current of ~5A whereas the positioning control during the constant velocity phase may require accurate supply of ~1 mA.

Additionally, the dissipation that occurs during acceleration or deceleration may deteriorate the overall process since it may result in thermal stresses in the object or object table.

In view of the above, the present invention is directed to at least partly overcoming some of the noted drawbacks and by providing a positioning device wherein at least part of the force requirement of the first drive unit during acceleration or deceleration is provided by a permanent magnet system.

Accordingly, the principles of the present invention, as embodied and broadly described herein, provide for an improved lithographic positioning device. In one embodiment, the lithographic positioning device comprises a first drive unit for positioning an object in a first direction within a first operating range, the first drive unit comprising a first part and a second part, the first part being connected to the object and movable relative to the second part. The device further comprises a second drive unit for displacing the first drive unit in the first direction within a second operating range, the second drive unit comprising a first part connected to the second part of the first drive unit and movable relative to a second part of the second drive unit. The device further comprises a permanent magnet system comprising a first part connected to either of the object or the first part of the first drive unit and a second part connected to either the second part of the first drive unit or the first part of the second drive unit, wherein the permanent magnet system is configured to generate a force for moving the object in the first direction, the force being a function of a relative position in the first direction of the object and the first part of the second drive unit.

In the drive arrangement of the present invention, as described above, the required force to accelerate or decelerate the object is at least partly provided by the permanent magnet system. Therefore, the actual force requirement of the first drive unit for acceleration or deceleration is reduced, resulting in a reduced dissipation during acceleration or deceleration. This reduced dissipation will enable a more stable (with respect to temperature) environment resulting in an improvement of the accuracy of the overall process. Since the actual force requirements of the first drive unit are reduced by the presence of the permanent magnet system, the first drive unit can be made smaller and lighter. This may result in an improved dynamic response which will enable a more accurate positioning of the object.

In case the first drive unit has become lighter, the overall mass to be displaced by the second drive unit may also have decreased. In this case, the force requirement for the second drive unit has also decreased resulting in a reduced dissipation of the second drive unit. The reduced dissipation occurring in either the first or second (or both) drive units may also favorably affect the requirements of the cooling unit (or units) that cool the drive units. Furthermore, reducing the force requirements of either of the drive units can simplify the design requirements for the amplifiers that supply the power to the drive units.

Alternatively, the arrangement according to the present invention can also be applied to increase the productivity of the apparatus wherein the positioning device is used by applying higher acceleration and deceleration. With the present invention, this may be achieved without an increase in dissipation of the first and second drive unit.

In its most basic form, the permanent magnet system consists of a first permanent magnet and a ferromagnetic member. As an example, a permanent magnet may be attached to the object table in such manner that it interacts with a ferromagnetic part of e.g. the moving part of the second drive unit thereby generating a force in the first direction. The permanent magnet can be arranged relative to the ferromagnetic part in such a way that, depending on the relative position of both parts, the generated force acts in the positive first direction or in the negative first direction.

In an embodiment of the present invention, the force of the permanent magnet system substantially equals zero for a first position of the first part of the first drive unit relative to the second part in the first direction inside the first operating range of the first drive unit. In this case, the permanent magnet system is in an equilibrium in said first position, i.e. the force acting between the different parts of the permanent magnet system has no component in the first direction. It may be beneficial to have such an equilibrium position inside the operating range of the first drive unit. The permanent magnet system may be positioned in such an equilibrium in case no acceleration or deceleration of the object table is required. It should be noted that the operating range of the first drive unit in the first direction may be much smaller than the displacement that is possible between the first part of the first drive unit and the second part of the first drive unit in said direction. The operating range in a first direction is considered to be the range over which the first part of the first drive unit can be displaced in that direction relative to the second part by the first drive unit itself.

In one embodiment, the first position of the first part of the permanent magnet system relative to the second part of the permanent magnet system (i.e. the equilibrium position) is substantially in the middle of the operating range of the first drive unit. It should further be noted that this equilibrium can be a stable equilibrium or an unstable equilibrium.

In an other embodiment of the present invention, the positioning device further comprises a control unit for controlling the different drive units by controlling the current in the coil units of the drive units. In a conventional system, the control units controls the currents in order to generate the appropriate forces to drive the object table. In the arrangement according to the present invention, the appropriate forces can also be generated by controlling the relative position between the parts of the permanent magnet system. In this respect, two different states can be considered.

In a first state, acceleration or deceleration of the object table is required. This can be achieved by a combined effort of the permanent magnet system, the first drive unit and the second drive unit. At least part of the acceleration (or deceleration) force can be provided by the permanent magnet system in case both parts of the permanent magnet system are brought into a position resulting in such a force. The positioning of both parts of the permanent magnet system relative to each other can be accomplished by controlling the currents of the first drive unit, the second drive unit or both.

In a second state it may be required to displace the object table at a speed that is substantially constant. In such a state, it may be preferred to position the permanent magnet system such that virtually no force is generated by the permanent magnet system in the direction of the displacement, i.e. the permanent magnet system should be positioned in the equilibrium position. This can also be accomplished by controlling the currents of the first drive unit, the second drive unit or both.

In a further embodiment, the permanent magnet system comprises an actuator for controlling the position of the first part of the permanent magnet system relative to the second part in the first direction. It may be beneficial to have a separate actuator controlling the relative position of both parts of the permanent magnet system in the first direction rather than controlling this position with the first drive unit. In such embodiment, the requirements of the first drive unit may be simplified since the main purpose of the first drive unit would become the accurate positioning during the constant velocity phase.

In another embodiment according to the present invention, the force in the first direction is generated by interaction between two permanent magnets, one attached to the object or to the first part of the first drive unit, the other can be attached to either the second part of the first drive unit or the first part of the second drive unit. In such an arrangement, the permanent magnets may be arranged to generate either a repelling force or an attractive force in the first direction between the parts they are attached to.

In yet another embodiment according to the present invention, the function describing the force of the permanent magnet system has a first derivative substantially equal to zero for said first position. In such an arrangement, the stiffness of the permanent magnet system with respect to the first direction is substantially zero in said first position. This provides an advantage with respect to the isolation of vibrations between the object table and the second part of the first drive unit attached to the second drive unit. Since the force generated by the permanent magnet system is substantially independent of the relative position of the parts of the permanent magnet system in the first direction in the mentioned position, vibrations occurring on the second drive unit will hardly be transmitted to the object, enabling an accurate positioning of the object.

In still another embodiment of the present invention, the permanent magnet system is constructed and arranged to generate a force in a second direction between the object and the moving part of the second drive unit, the second direction being preferably perpendicular to the first direction. In such an arrangement the permanent magnet system can at least partly provide the acceleration and deceleration force required to displace the object table in both first and second directions. This may result in either a reduction in dissipation in the first drive unit and/or the second drive unit. Introducing this permanent magnet system may enable the use of a smaller (and lighter) first drive unit, thereby improving the dynamic response of the first drive unit and possibly a reduction in the force requirements for the second drive unit. In such an arrangement, the second drive unit may, as an example, be a planar motor or an H-bridge type drive arrangement.

In a further embodiment, the positioning device is further equipped with a crash protection mechanism to avoid that sensitive parts of the first and second part of the first drive unit (e.g. coils, permanent magnets) touch each other.

According to a further aspect of the invention there is provided a device manufacturing method comprising the steps of: providing a substrate that is at least partially covered by a layer of radiation-sensitive material; providing a projection beam of radiation using a radiation system; using patterning device to endow the projection beam with a pattern in its cross-section; projecting the patterned beam of radiation onto a target portion of the layer of radiation-sensitive material; positioning at least one of said patterning device or substrate by means of a positioning device comprising a first drive unit comprising a first part and a second part, the first part being connected directly or indirectly to said object and movable relative to the second part, a second drive unit for displacing said first drive unit in at least one direction, the second part of the first drive unit being connected to said second drive unit. a permanent magnet system for at least partly generating the force for accelerating or decelerating the object table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the holding structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens"

herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
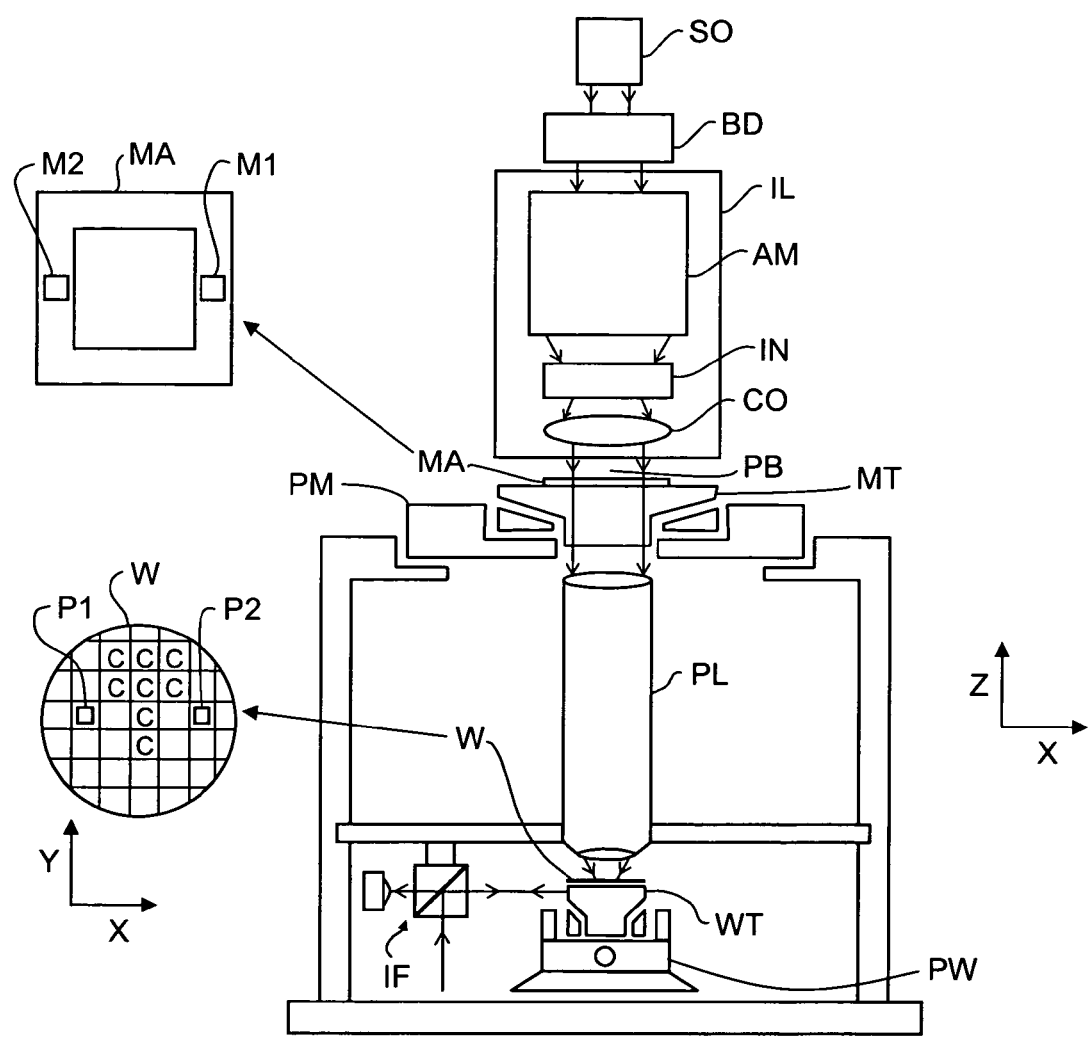
FIG. 1 depicts a lithographic apparatus according to an embodiment of the invention.

FIG. 1 schematically depicts a lithographic apparatus 100 according to a particular embodiment of the invention. The apparatus comprises:

- an illumination system (illuminator) IL: for providing a projection beam PB of radiation (e.g. UV or EUV radiation).
- a first support structure (e.g. a mask table/holder) MT: for supporting patterning device (e.g. a mask) MA and connected to first positioning mechanism PM for accurately positioning the patterning device with respect to item PL;
- a substrate table (e.g. a wafer table/holder) WT: for holding a substrate (e.g. a resist-coated wafer) W and connected to second positioning mechanism PW for accurately positioning the substrate with respect to item PL; and
- a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments

Figure 2:
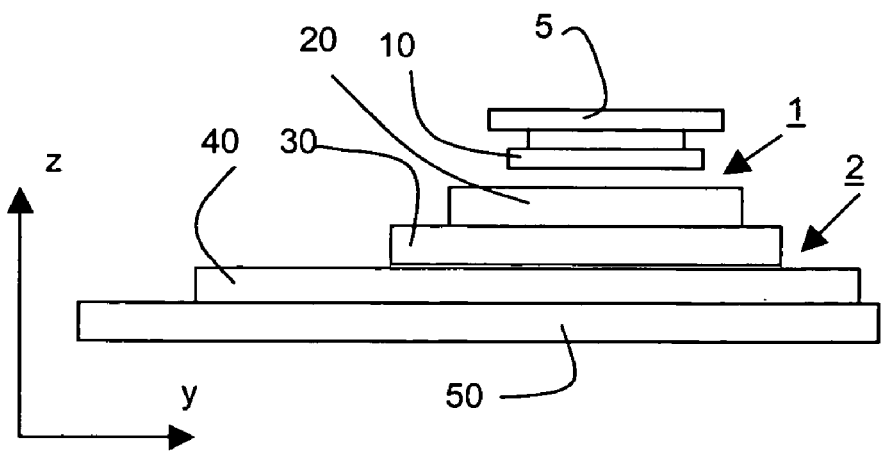
FIG. 2 schematically depicts a positioning device comprising a first and second drive unit as known in the art.

FIG. 2 schematically depicts a positioning device as known in the art, comprising a first drive unit 1 mounted on a second drive unit 2. Such a positioning device can be applied to position an object table provided with a substrate or a patterning device. The first drive unit 1 comprises a first part 10 attached to an object table 5 and a second part 20 attached to a first part 30 of the second drive unit. The second drive unit 2 further comprises a second part 40 that can be mounted, as an example, to a frame or a balance mass 50. The first and second part of the second drive unit 2 can be positioned relative to each other over comparatively large distances in at least one direction (Y-direction in FIG. 2).

Typically, the displacement of >500 mm can be obtained with a micrometer accuracy. As an example, the second drive unit may comprise a planar motor, an H-type drive or a linear motor construction. Such drive arrangements may be applied in a lithographic apparatus as shown in FIG. 1 for moving the object tables MT and WT. As the second part of the first drive unit is attached to the first part of the second drive unit, this part moves along with the first part of the second drive unit. The first drive unit is used as a fine adjustment drive. It is used to position the object table over comparatively small distances (~1 mm) with a nanometer accuracy. Since the first drive moves along with the second drive, the combined first and second drive unit may combine the advantage of allowing large displacements (obtained from the second drive unit) with a high accuracy (obtained from the first drive unit).

Figure 3A:
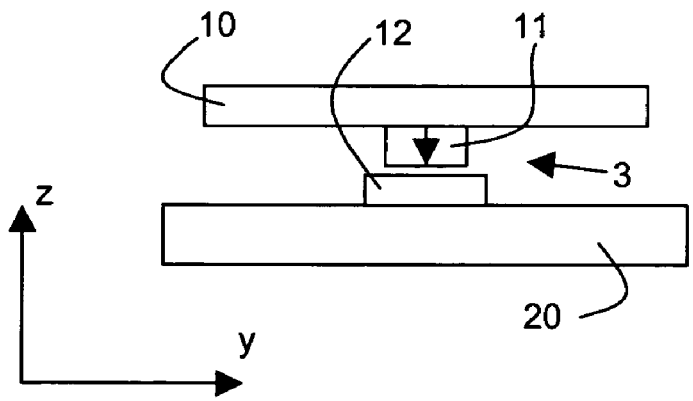
FIG. 3a schematically depicts a first embodiment of a positioning device according to the present invention in a first position.

FIG. 3a schematically depicts a first embodiment of a positioning device according to the present invention. The figure schematically shows the first drive unit (comprising of the first part 10 and the second part 20) in combination with a permanent magnet system 3. The second drive unit and the object table are not shown. The permanent magnet system 3 comprises a first part comprising a permanent magnet 11 attached to the first part 10 of the drive unit and a second part comprising a ferromagnetic part 12 attached to the second part 20 of the drive unit.

Figure 3B:
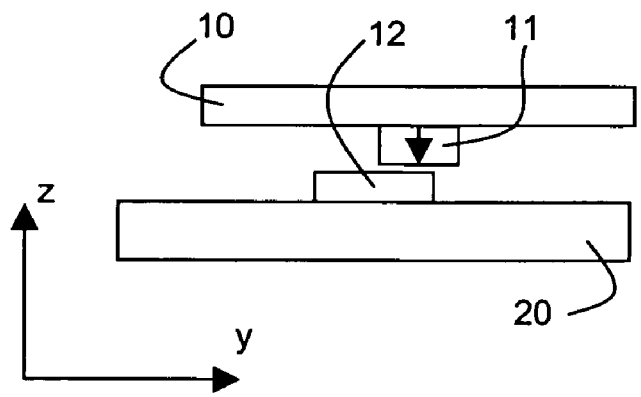
FIG. 3b schematically depicts the first embodiment in a second position with respect to the Y-direction.
Figure 3C:
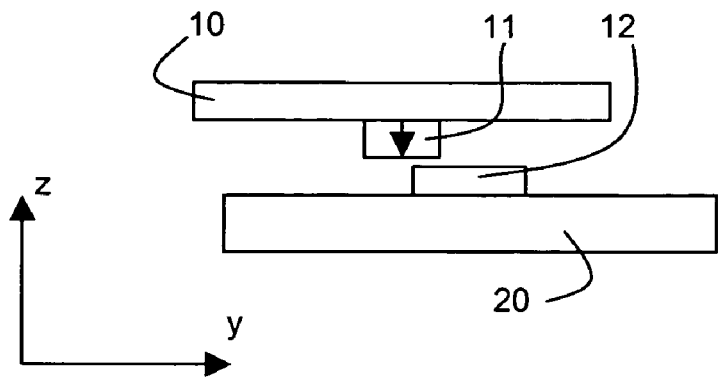
FIG. 3c schematically depicts the first embodiment in a third position with respect to the Y-direction.

The interaction between the permanent magnet 11 and the ferromagnetic part 12 results in an attractive force between both parts. For the relative position as depicted in FIG. 3a, this force is directed in the Z-direction. This force, directed in the Z-direction can, as an example, be compensated by an actuator or a bearing such as an air bearing. In case the first and second part of the first drive unit have a different relative position with respect to the Y-direction, the attractive force between both parts (generated by the permanent magnet system) will also have a component in the Y-direction (see FIGS. 3b and 3c). This force component in the Y-direction is directed to restore the symmetric (equilibrium) situation as shown in FIG. 3a. Therefore, in FIG. 3b, this force component acts in the negative Y-direction on the permanent magnet (and in the positive Y-direction on the ferromagnetic part), while in FIG. 3c, the force acts in the positive Y-direction on the permanent magnet (and in the negative Y-direction on the ferromagnetic part).

Figure 4:
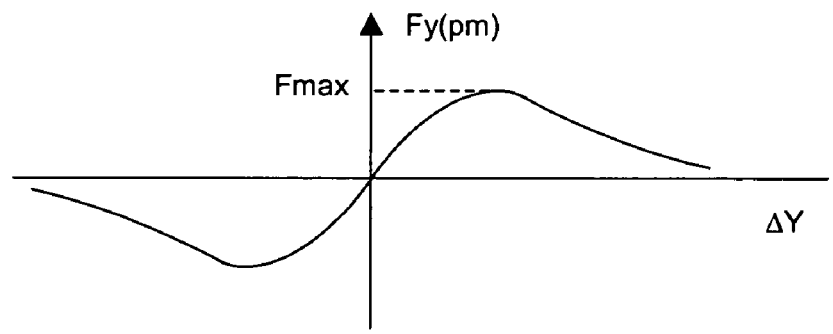
FIG. 4 schematically depicts the force characteristic of the first embodiment of a positioning device according to the present invention.

FIG. 4 schematically depicts the Y-direction force component acting on the permanent magnet Fy(pm) as a function of the relative position of the permanent magnet and the ferromagnetic part in the Y-direction. The relative position of the permanent magnet and the ferromagnetic part ($\Delta Y$) is defined as:

$$\Delta Y = Y_{ferromagnetic\_part} - Y_{permanent\_magnet}$$

wherein:

$Y_{ferromagnetic\_part}$=Y-position of the ferromagnetic part
$Y_{permanent\_magnet}$=Y-position of the permanent magnet It is further assumed that the situation $\Delta Y=0$ corresponds to the symmetrical position as shown in FIG. 3a and that a positive value of Fy(pm) corresponds to a force acting on the permanent magnet directed in the positive Y-direction.

This force can be applied to at least partly provide the required acceleration or deceleration force of the first drive unit as follows:

In order to accelerate the object table in e.g. the positive Y-direction, the second drive unit may engage in that direction. This will result in a displacement of the second part 20 of the first drive unit in positive Y-direction. As soon as the second part of the first drive unit is displaced in the positive Y-direction, a positive $\Delta Y$ will occur and (as can be seen from FIG. 4) a force directed in the positive Y-direction will act on the permanent magnet. Due to this force, the first part of the first drive unit, together with the object table attached to it will accelerate in the positive Y-direction. As long as both first and second part of the first drive unit don't have the same speed, the relative displacement in the Y-direction between the permanent magnet and the ferromagnetic part will increase.

As shown in FIG. 4 however, an increase in the relative displacement will result in an increased force acting on the permanent magnet and will therefore increase the acceleration of the first part of the first drive unit together with the object table. It should be noted that the force generated by the permanent magnet system is limited to Fmax as indicated in FIG. 4. If a higher force is required for accelerating the object table, this force may be provided by the first drive unit.

To maintain the speed of the object table at a constant level, the relative position $\Delta Y$ has to be brought back to zero. This can be done by decelerating the second drive unit.

To decelerate the first drive unit (and object table), the second drive unit can be decelerated even further in order to create a relative displacement between permanent magnet and ferromagnetic part that will generate a force in negative Y-direction on the permanent magnet ($\Delta Y < 0$). During both the acceleration/deceleration phase and the constant velocity phase, the first drive unit can be applied to control or modify the relative position $\Delta Y$.

Figure 5A:
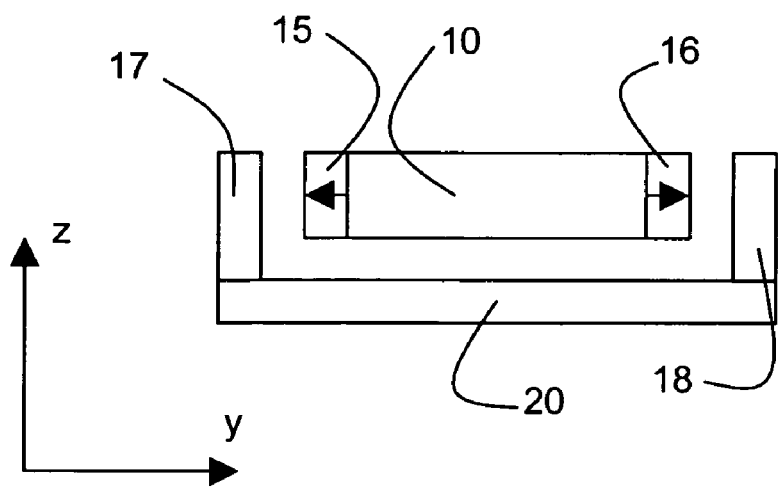
FIG. 5a schematically depicts a second embodiment of a positioning device according to the present invention.

FIG. 5a schematically depicts an alternative arrangement of the permanent magnet system. In this arrangement, the permanent magnet system comprises a first part comprising two permanent magnets 15, 16 attached to the first part of the first drive unit. Each magnet is arranged to interact with a ferromagnetic part 17, 18 of the second part of the permanent magnet system mounted on the second part of the first drive unit.

In this arrangement, in case the distance in the Y-direction between the magnet 15 and the ferromagnetic part 17 equals the distance in the Y-direction between the magnet 16 and the ferromagnetic part 18, the attractive forces acting between the magnet 15 and the ferromagnetic part 17 and between the magnet 16 and the ferromagnetic part 18 will substantially cancel. Since the first drive unit is equipped for driving the object table in the Y-direction, the first drive unit can be applied to maintain the first part 10 of the first drive relative to the second part 20 in that position.

In order to at least partly accelerate or decelerate the object table by means of the attractive forces generated by the permanent magnet system the following scenario can be applied.

In order to accelerate the first part of the first drive unit in the positive Y-direction, the first drive unit can generate a force to displace the first part of the first drive in the positive Y-direction relative to the second part. This will enable the attractive force between the permanent magnet 16 and the ferromagnetic part 18 to be larger than the attractive force between the permanent magnet 15 and the ferromagnetic part 17. Due to the resulting force, the first part 10 will accelerate in the positive Y-direction. The resulting force will increase as long as the gap between magnet 16 and ferromagnetic part 18 decreases. In order to avoid that the gap becomes to small, the second drive unit will have to engage as well in the positive Y-direction.

To reduce the acceleration of the first drive unit, the gap between the magnet 16 and the ferromagnetic part 18 has to increase again, to stop the acceleration of the first drive unit, the gap has to be made substantially equal to the gap between the permanent magnet 15 and the ferromagnetic part 17. This can be achieved by either accelerating the second drive unit until it has a higher speed than the first drive unit, or by reducing the speed of the first drive unit by generating a force in the negative Y-direction (by the first drive unit itself) or a combination of both approaches.

For decelerating the first drive unit by means of the permanent magnet system, the gap between permanent magnet 15 and the ferromagnetic part 17 has to be made smaller than the gap between the permanent magnet 16 and the ferromagnetic part 18. This can also be achieved by generating a force in the negative Y-direction by the first drive unit (to reduce the speed of the first part of the first drive unit compared to the speed of the second part of the first drive unit) or by accelerating the second drive unit to a higher speed than the first drive unit or by combining both approaches. In case electromagnetic actuators or motors are applied in the first and second drive unit, the required forces of the drive units is generated by supplying the actuators or motors with the appropriate currents.

Figure 5B:
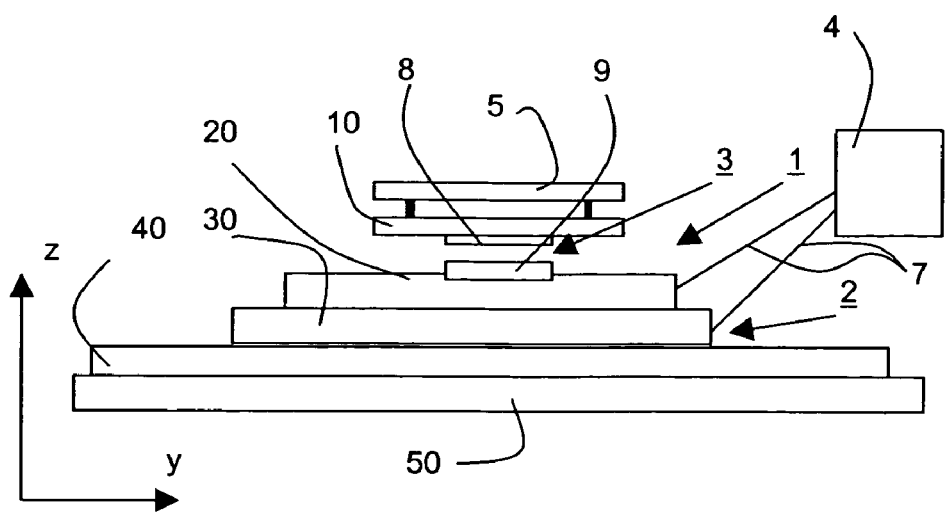
FIG. 5b schematically depicts the positioning device according to the present invention including a control unit for controlling the first and second drive unit.

The currents supplied to the drive units are controlled by a control unit 4, as schematically depicted in FIG. 5b. FIG. 5b schematically shows the first drive unit 1 comprising the parts 10 and 20, the second drive unit 2 comprising the parts 30 and 40, the permanent magnet system 3 comprising a first part 8 attached to the first part 10 of the first drive unit 1 and a second part 9 attached to the second part 20 of the first drive unit 1 and the control unit 4 controlling the currents of the first and second drive unit (schematically indicated by the connections 7).

In the arrangement shown in FIG. 5b, the coil units of the actuators of the drive units are present in the second part 20 of the first drive unit 1 and in the first part 30 of the second drive unit 2, as indicated by the connections 7. The coil units may also be located in the first part of the first drive unit 10 or in the second part of the second drive unit 40.

As an alternative, or in addition to, the positioning device may be equipped with a separate actuator to control and modify the relative position $\Delta Y$ between both parts 10 and 20. This may be advantageous since this may further reduce the force requirements of the first drive unit in the Y-direction enable the first drive unit to focus on the accurate positioning during the constant velocity phase. It should be noted that such an arrangement (i.e. with an additional actuator) can also be applied in the embodiments described further. In case such an actuator is applied, it may also be controlled by the control unit 4 that controls the first and second drive unit.

Compared to the embodiment shown in FIG. 3a, the embodiment of FIG. 5a requires more control effort to maintain the first drive unit at the appropriate position and speed. This is due to the fact that embodiment in FIG. 3a provides a stable equilibrium for displacement of the first part relative to the second part in the Y-direction while the embodiment in FIG. 5a provides an unstable equilibrium for displacement of the first part relative to the second part in the Y-direction. Comparing both embodiments, it will be appreciated that in both embodiments, the force, generated by the permanent magnet system, acting between both parts of the first drive unit is due to attraction between permanent magnets and ferromagnetic parts.

Figure 6:
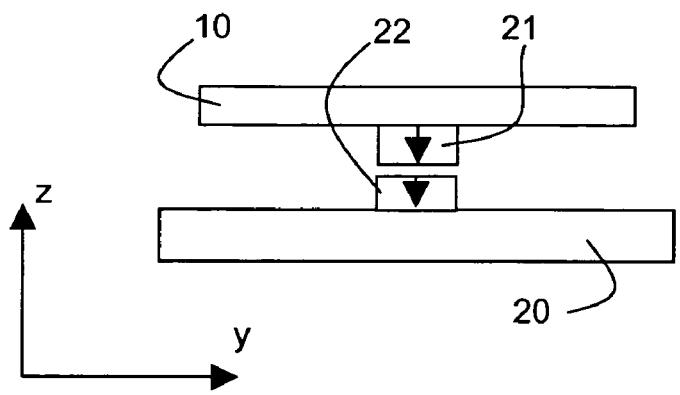
FIG. 6 schematically depicts a third embodiment of a positioning device according to the present invention.

The following two embodiments can be considered equivalents to these since they rely on attractive forces between permanent magnets. FIG. 6 shows an embodiment wherein the permanent magnet system comprises a first magnet 21 attached to the first part of the first drive unit and a second magnet 22 attached to the second part of the first drive unit. As is the case in FIG. 3a, the attractive force in Z-direction between both magnets 21 and 22 can be compensated by means of an actuator or a bearing. With respect to the Y-direction, a stable equilibrium is obtained in the relative position of both magnets as shown in FIG. 6. When the first part 10 of the first drive unit is displaced relative to the second part 20 in either the positive Y-direction or the negative Y-direction, an attractive force occurs that tries to restore the equilibrium. With respect to the embodiments shown in FIGS. 3 and 6, it should be noted that a plurality of permanent magnet systems as shown can be attached to the first and second part of the drive unit along the Y-direction. This will improve the mechanical stability with respect to tilting around the X-axis.

Figure 7:
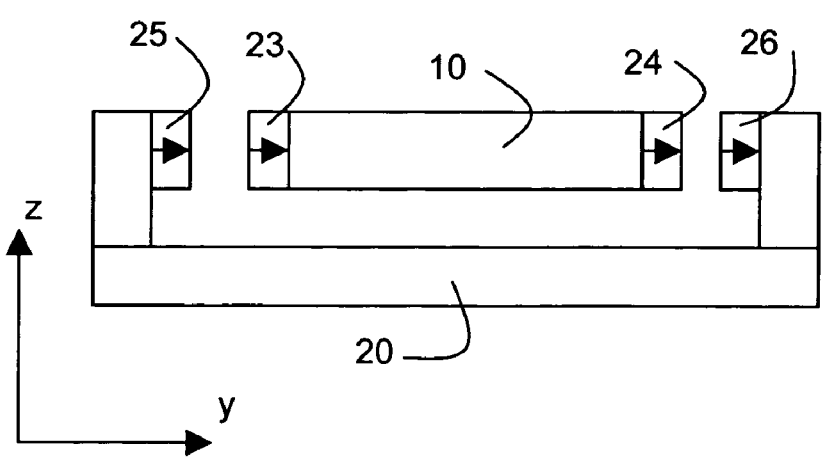
FIG. 7 schematically depicts a fourth embodiment of a positioning device according to the present invention.

An alternative embodiment to that depicted by FIG. 5, FIG. 7 that the permanent magnet system comprises two permanent magnets 23, 24 attached to the first part 10 of the first drive unit and two permanent magnets 25, 26 attached to the second part 20 of the first drive unit. As can be seen from FIG. 7, the permanent magnets 23, 24, 25 and 26 are arranged in such manner that an attractive force is generated between magnets 23 and 25 and between magnets 24 and 26. This results (as in FIG. 5) an unstable equilibrium in the Y-direction between the first part 10 and the second part 20 of the first drive unit when the distance (in Y-direction) between magnets 23 and 25 is substantially equal to the distance between magnets 24 and 26 (provided the magnets are of the same strength and size).

Figure 8:
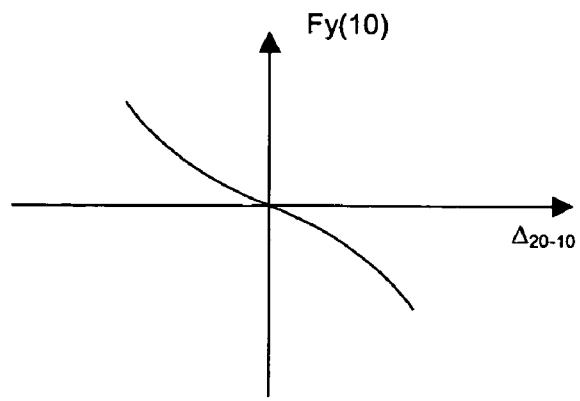
FIG. 8 schematically depicts the force characteristic of the fourth embodiment of a positioning device according to the present invention.

This is illustrated in FIG. 8 which indicates that the force in Y-direction Fy(10) acting on the magnets 23, 24 (i.e. the force that can accelerate or decelerate item 10) as a function of the relative displacement in Y-direction of items 10 and 20, $\Delta_{20-10}$. $\Delta_{20-10}$ is defined as:

$$\Delta_{20-10} = Y_{20} - Y_{10}$$

wherein

Y20=the Y-position of part 20 (second part of the first drive unit),

Y10=the Y-position of part 10 (first part of the first drive unit).

It is further assumed that the situation $\Delta_{20-10}=0$ corresponds to the situation wherein the first part 10 of the first drive unit is positioned symmetrically to the second part 20 with respect to the Y-direction. As can be seen from FIG. 8, in case Y20>Y10, the magnetic force acting on item 10 Fy(10) will be directed in the negative Y-direction. Y20>Y10 corresponds to a situation wherein the gap between magnets 25 and 23 is smaller than the gap between the magnets 24 and 26. The generated force is directed to further decrease of the gap between the magnets 25 and 23. So, contrary to the situation in FIG. 4, the force is not directed to restore the equilibrium situation.

Figure 9:
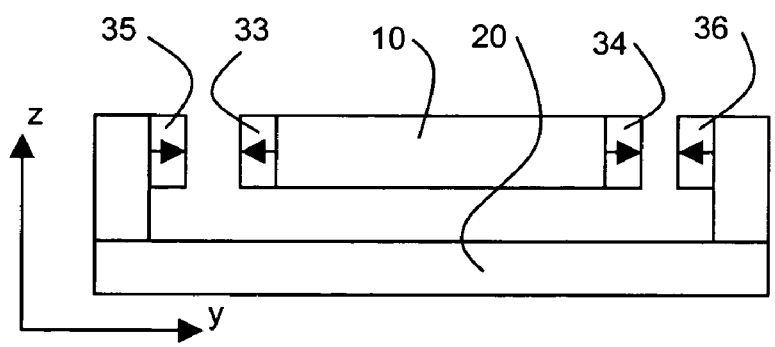
FIG. 9 schematically depicts a fifth embodiment of a positioning device according to the present invention.
Figure 10:
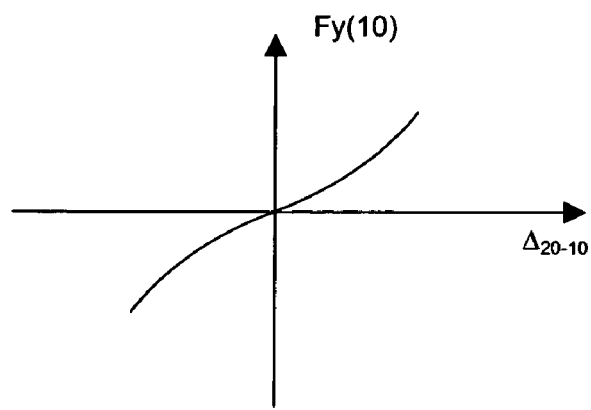
FIG. 10 schematically depicts the force characteristic of the fifth embodiment of a positioning device according to the present invention.

Another embodiment according to the present invention is shown in FIG. 9. This figure shows an embodiment that, with respect to the layout, resembles the embodiments shown in FIGS. 5a, 7 but, with respect to the control aspects, is more comparable to the embodiments of FIGS. 3a, 5a. In this embodiment, the permanent magnet system comprises a first part comprising two magnet 33 and 34 attached to the first part 10 of the first drive unit and a second part comprising two magnets 35 and 36 attached to the second part 20 of the first drive unit. The permanent magnets are arranged in such manner that a repelling force is generated between magnets 35 and 33 and between magnets 34 and 36. In this arrangement, the permanent magnet system provides a stable equilibrium with respect to displacements in the Y-direction of the first part 10 relative to the second part 20. The force acting on the first part 10 as a function of the relative position of items 10 and 20 is shown in FIG. 10.

In comparing the embodiments of FIGS. 3 and 6 with the embodiments shown in FIGS. 5a, 7 and 9, the following difference should be noted: The permanent magnet system applied in the embodiments of FIGS. 3 and 6 allow an unlimited displacement of the first part 10 relative to the second part 20 with respect to the Y-direction. This is due to the fact that the parts that form the permanent magnet system are positioned adjacent to each other in a direction perpendicular to the Y-direction (i.e. the Z-direction for the embodiments of FIGS. 3 and 6).

However, in the embodiments shown in FIGS. 5a, 7 and 9, the displacement of the first part 10 relative to the second part 20 with respect to the Y-direction is limited due to the fact that the part that form the permanent magnet system (e.g. magnets 33, 34 and magnets 35, 36) are positioned adjacent to each other in the Y-direction. The following figures show some alternative arrangements that allow a larger displacement of the first part 10 relative to the second part 20 with respect to the Y-direction, compared to the embodiments of FIGS. 5a, 7 and 9.

Figure 11:
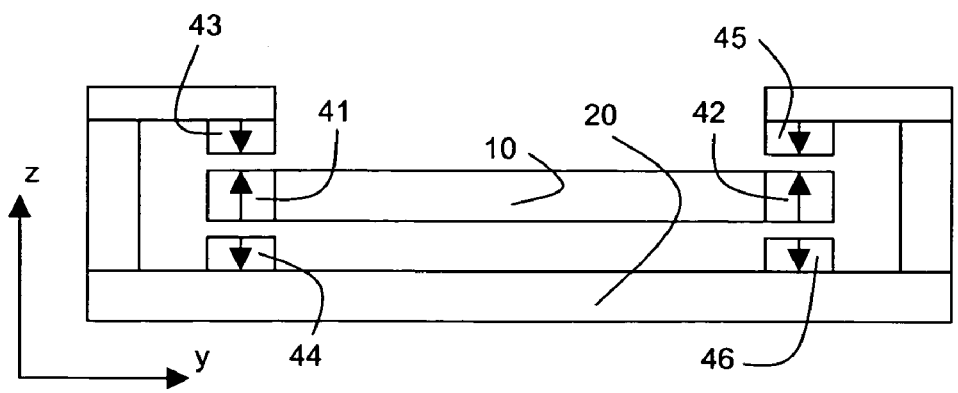
FIG. 11 schematically depicts a sixth embodiment of a positioning device according to the present invention.

In FIG. 11, the permanent magnet system comprises a first part comprising four permanent magnets 43, 44, 45, 46 attached to the second part 20, arranged to co-operate with a second part comprising two permanent magnets 41, 42 attached to the first part 10. In this arrangement, the permanent magnet systems can generate a force in the Y-direction between first and second part. The arrangement provides an unstable equilibrium with respect to displacements in the Y-direction. Because the magnets are positioned adjacent to each other in a direction perpendicular to the Y-direction, the displacement of the first part relative to the second part is not hindered by the magnets.

Figure 12:
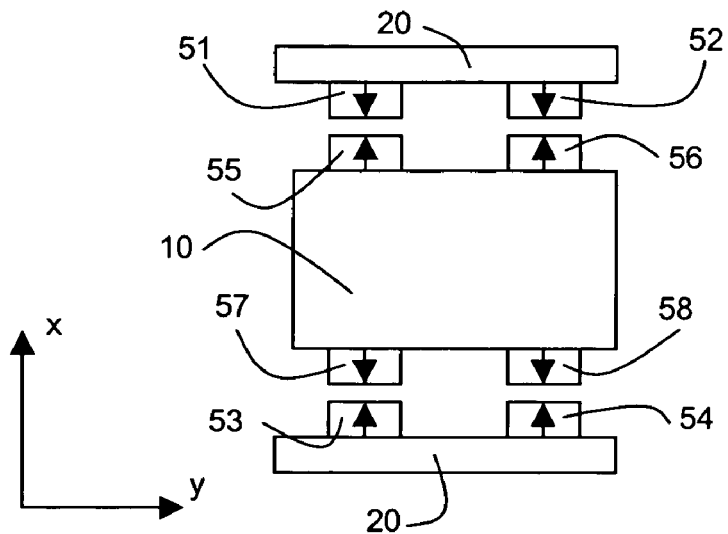
FIG. 12 schematically depicts a seventh embodiment of a positioning device according to the present invention.

Alternatively, the magnets may also be arranged adjacent to each other in the X-direction as is illustrated in FIG. 12. This figure shows an XY-view of a permanent magnet arrangement wherein the permanent magnet system comprises 4 permanent magnets 51, 52, 53 and 54 attached to the second part 20 of the first drive unit and 4 permanent magnets 55, 56, 57, and 58 attached to the first part 10 of the first drive unit. The permanent magnet system provides an unstable equilibrium with respect to displacements in the Y-direction.

Regarding the embodiments as discussed relative to FIGS. 3 to 12, it should be noted that the force characteristic (as shown in the FIGS. 4, 8 and 10) has a non-zero slope at the equilibrium point at $\Delta Y=0$ or $\Delta_{20-10}=0$. Assuming that the additional components that are located between the first part 10 and the second part 20 of the first drive unit (i.e. magnet assemblies and coil assemblies of the actuators of the first drive unit) provide a near-zero stiffness in the operating range of the first drive unit, the stiffness of the permanent magnet system may adversely affect the transmission of vibrations between the second part 20 of the first drive unit (that is mounted on the first part of the second drive unit) and the first part 10 that is connected to the object table.

Figure 13:
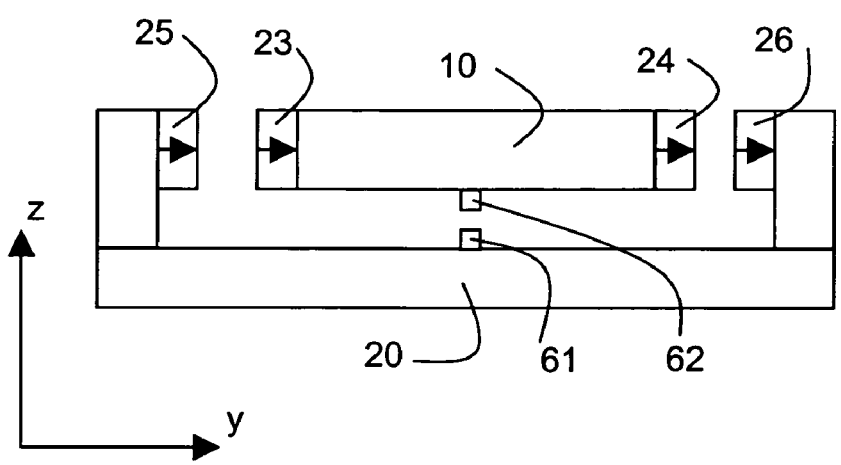
FIG. 13 schematically depicts an eight embodiment of a positioning device according to the present invention.

In order to overcome this, a permanent magnet arrangement that provides a stable equilibrium can be combined with a permanent magnet arrangement that provides an unstable equilibrium. By appropriate scaling of both assemblies, a small area of near-zero stiffness can be realized around the equilibrium point. Such an arrangement is illustrated in FIG. 13, which combines the permanent magnet arrangement of FIG. 7 (comprising the permanent magnets 23, 24, 25, 26) with a permanent magnet arrangement according to FIG. 3 or 6.

Figure 14:
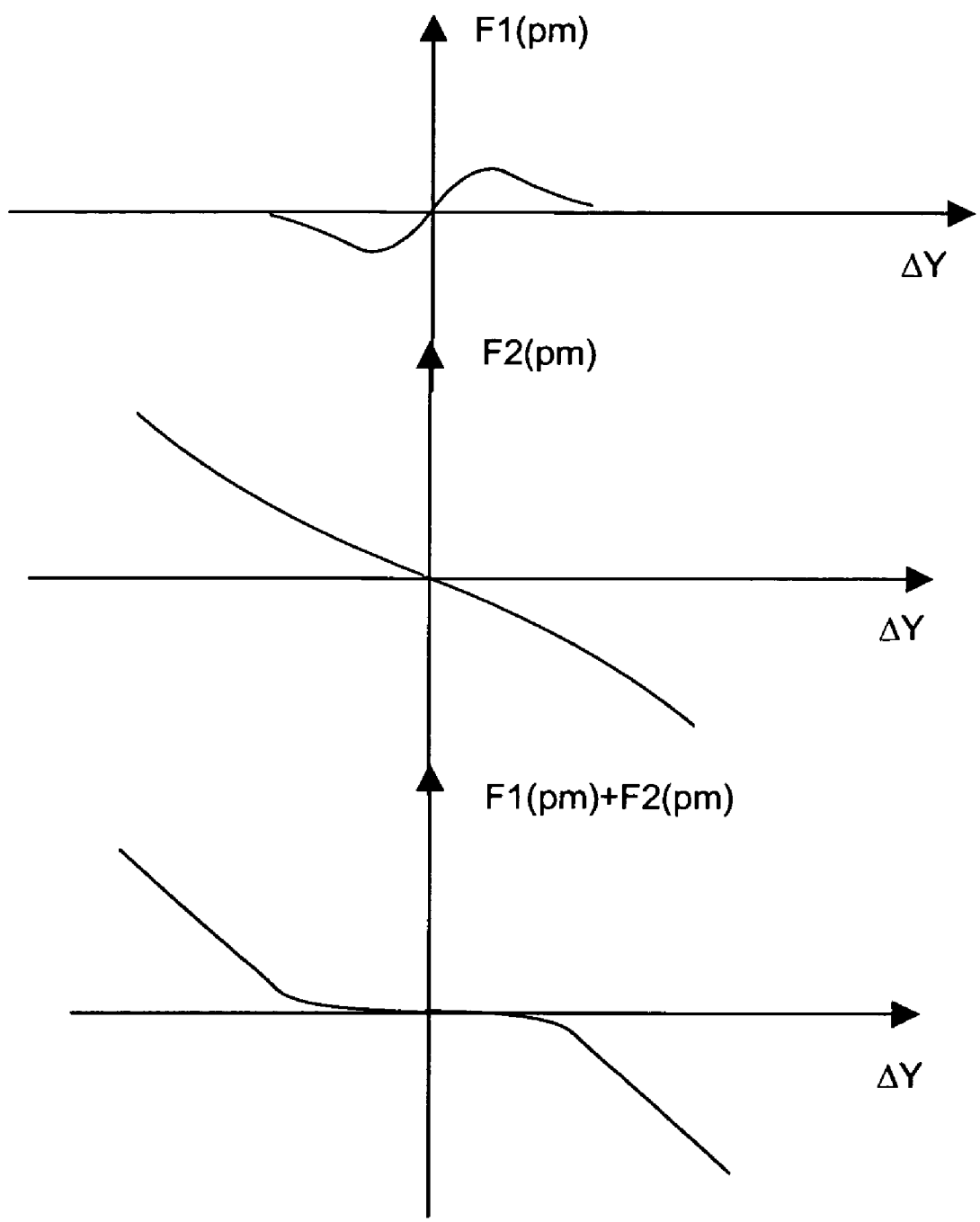
FIG. 14 schematically depicts the force characteristic of the eighth embodiment of a positioning device according to the present invention.

The latter magnet arrangement is schematically depicted by elements 61 and 62 attached to the first part 10 and the second part 20 of the first drive unit. At least one of the elements 61 and 62 should be a permanent magnet. In case both elements are permanent magnets, they should be arranged to provide a stable equilibrium with respect to displacements in the Y-direction, as in the embodiment of FIG. 6. The resulting force characteristic can be found by adding the characteristics of both magnet arrangements as is shown in FIG. 14. The upper graph of FIG. 14 shows the force in Y-direction acting on the first part 10 due to the interaction of the elements 61 and 62. This graph is similar to the graph of FIG. 4. The middle graph schematically shows the force in Y-direction acting on the first part 10 due to the interaction of the permanent magnets 23, 24, 25 and 26. It will be appreciated that by appropriately scaling elements 61 and 62, relative to the permanent magnet system of the magnets 23, 24, 25 and 26, both force characteristics can be scaled relative to each other, both with respect to the generated force and with respect to the operating range.

The bottom graph schematically shows the sum of the upper and middle graph. As illustrated by the bottom graph, by combining a first permanent magnet system that provides an unstable equilibrium (with respect to the Y-direction) with a second permanent magnet system that provides a stable equilibrium, an operating area is realized with a near zero stiffness. By appropriate scaling/designing both permanent magnet systems, this area with a near zero stifffiess can be made smaller or larger. Depending on the application, a small area of near-zero stiffness (~200 e-6 m) might be sufficient. Although the principle of combining a first permanent magnet system that provides an unstable equilibrium (with respect to the Y-direction) with a second permanent magnet system that provides a stable equilibrium is only illustrated by one embodiment (see, FIG. 13), it will be clear that similar arrangements can be made by other combinations of permanent magnet systems.

Alternatively, a near-zero stiffness area can be achieved by altering the geometric or magnetic parameters of the arrangements of FIGS. 3–12, in order to create an equilibrium with near zero stiffness over a small part of the operating area. An example of such a modification is shown in FIG. 15, in which arrangement (a) of FIG. 15 corresponds to the embodiment shown in FIG. 6, with the corresponding force characteristic is shown in part (e) of FIG. 15.

Figure 15:
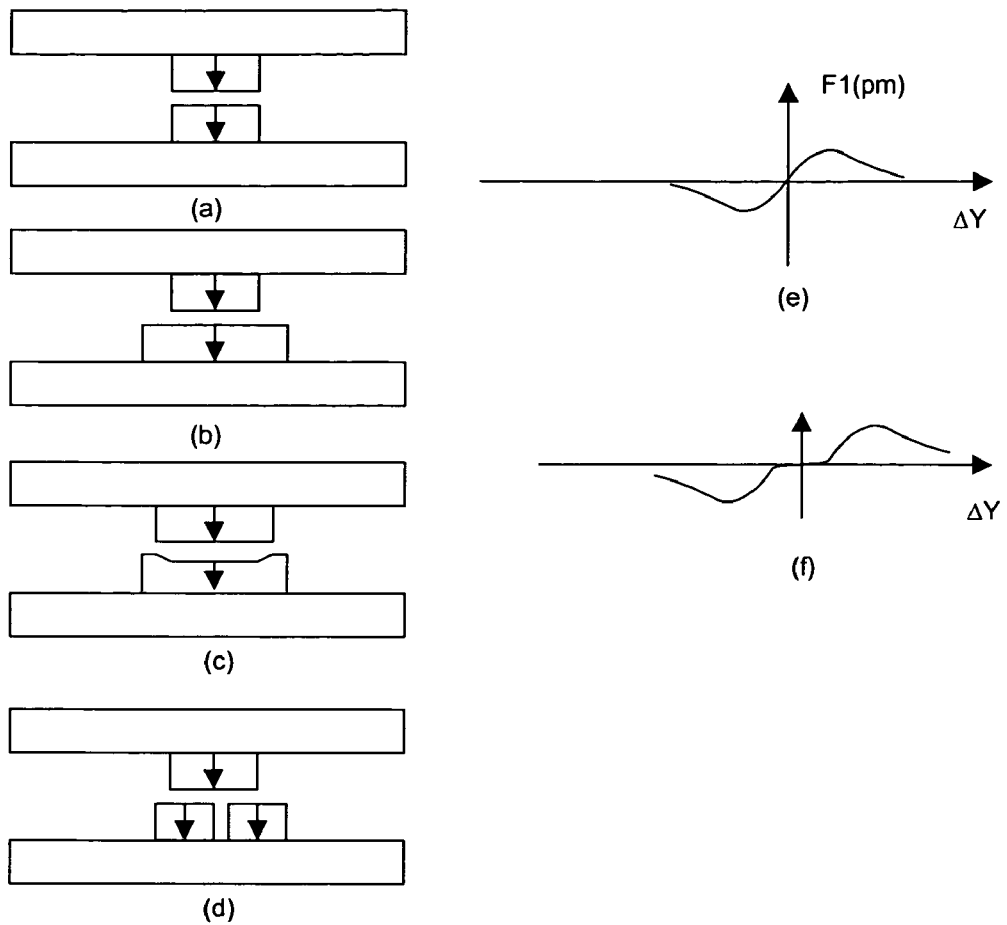
FIG. 15 schematically depicts different modifications on the third embodiment of a positioning device according to the present invention.

Arrangements (b), (c) and (d) describe modifications to arrangement (a) that modify the force characteristic to a characteristic with an area having a near-zero slope, as shown in part (f) of FIG. 15. As can be seen from the figure, the modifications required to alter the force characteristic may be altering the geometry of one of the parts of the permanent magnet system (as done in arrangements (b) and (c)) or subdividing one of the parts of the permanent magnet system.

It will be appreciated that similar modifications can be performed to reduce the stiffness of the other disclosed embodiments as well. In order to obtain an optimal performance with respect to stiffness, different measures can be taken. As already shown in FIGS. 13 and 15, these measures may include combining different permanent magnet systems or modifying the geometry of one or more parts of the permanent magnet system. These geometric modifications may include shaping the different parts or subdividing one or more parts into different parts, or a combination of both. Additionally, magnetic modifications may be introduced as well. Such modifications may include applying different magnetic materials (soft magnetic or hard magnetic), introducing additional magnetic (soft magnetic or hard magnetic) parts to adjust the magnetic interaction between both parts of the permanent magnet system.

It will also be appreciated that, by means of conventional calculation methods such as, for example, finite element or boundary element methodologies, both the magnetic and geometric parameters of the permanent magnet system can be found that results in a required performance with respect to both stiffness and generated driving force.

In a further embodiment according to the present invention, the permanent magnet system is arranged to generate a force between the object table and the first part of the second drive unit in a second direction substantially parallel to the first direction. Such an arrangement is favorable in case acceleration and deceleration of the object table in both first and second direction are required. Such a situation occurs in the positioning of a substrate table in a lithographic apparatus. Possible arrangements of the permanent magnet system are shown in the following figures.

Figure 16:
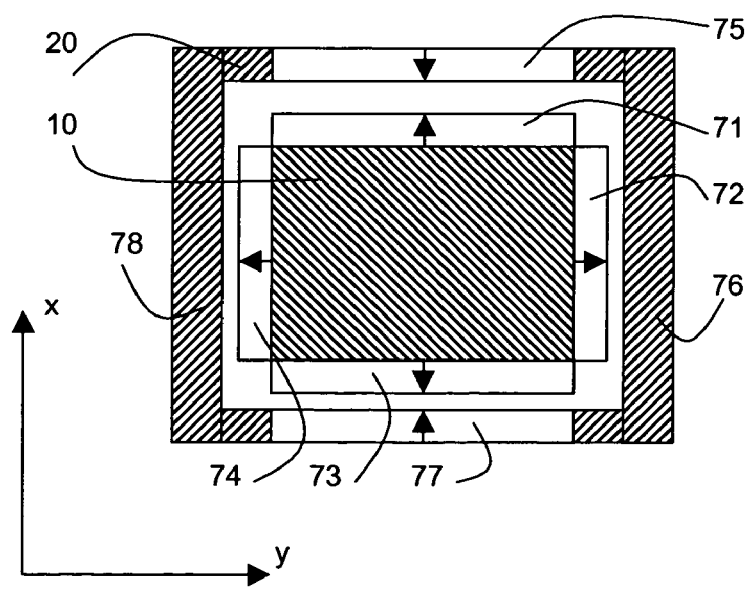
FIG. 16 schematically depicts a ninth embodiment of a positioning device according to the present invention.

FIG. 16 illustrates a first embodiment of a permanent magnet system arranged to provide a force to accelerate or decelerate an object table in both a first (Y) and a second direction (X). FIG. 16 shows an XY-view of this arrangement. The first part of the permanent magnet system comprises four magnets 71, 72, 73 and 74 attached to the first part 10 of the first drive unit. Those magnets are arranged to interact with the second part of the permanent magnet system comprising two permanent magnet 75 and 77 and two ferromagnetic parts 76 and 78 attached to the second part 20 of the first drive unit. This arrangement can be applied to generate acceleration or deceleration forces between the object table and the first part of the second drive unit.

The embodiment can be seen as a combination of the arrangement of FIG. 5 with respect to the Y-direction (providing an unstable equilibrium) and the arrangement of FIG. 9 with respect to the X-direction (providing a stable equilibrium). Other combinations of the embodiments shown in FIGS. 3–15 may also be combined to provide a permanent magnet system that can generate acceleration or deceleration forces in both X- and Y-direction. This may result in an embodiment that is stable in one direction and unstable in the other direction (as in the example of FIG. 16) or an embodiment that is stable in both directions or unstable in both directions. It will be clear that those embodiments may also generate acceleration or deceleration force in any direction in the XY-plane.

Figure 17A:
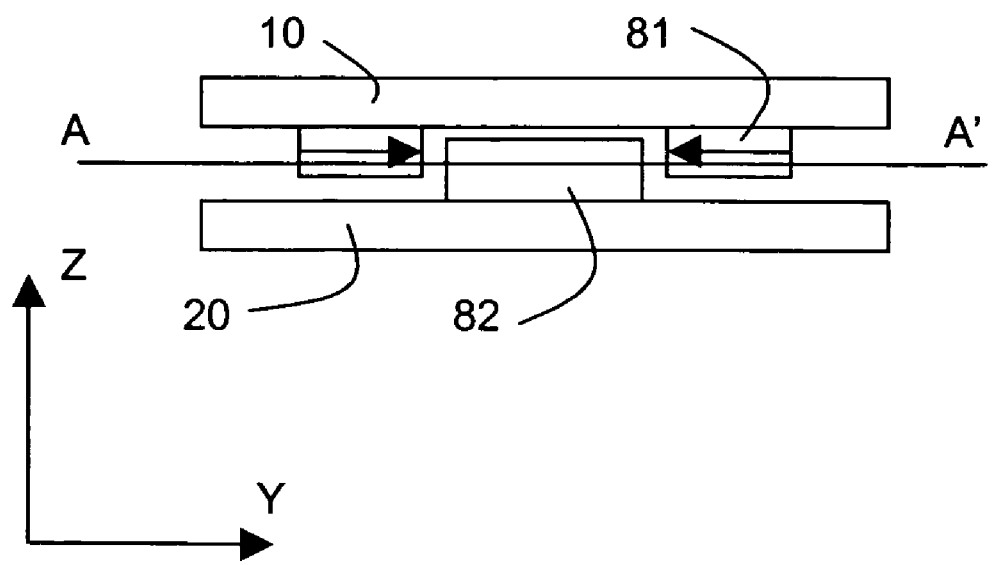
FIG. 17a schematically depicts an YZ-view of a tenth embodiment of a positioning device according to the present invention.
Figure 17B:
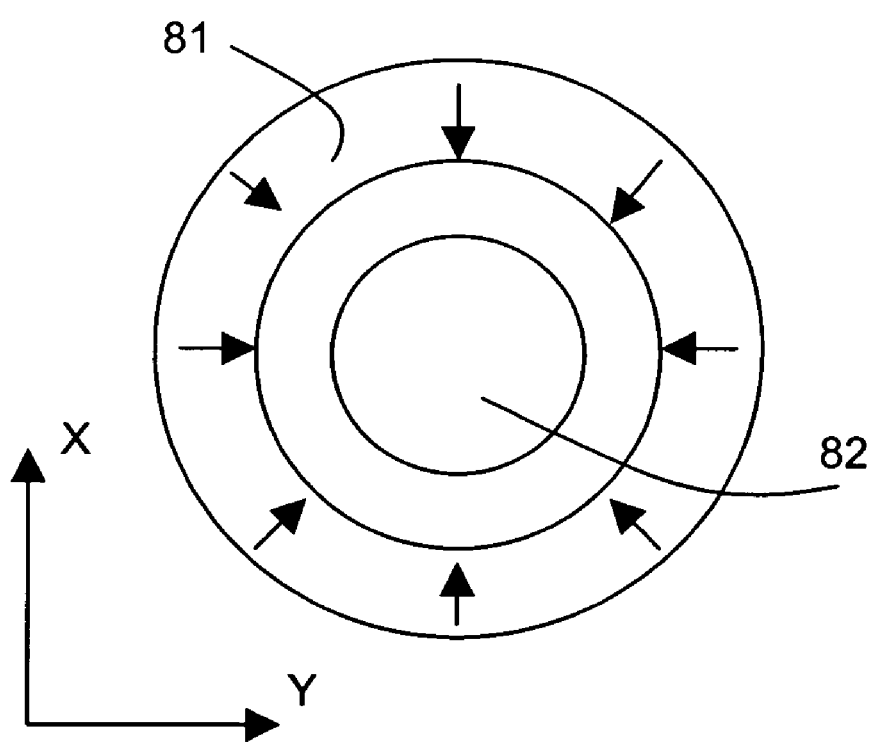
FIG. 17b schematically depicts an XY-view of the tenth embodiment of a positioning device according to the present invention.

A permanent magnet system that is capable of providing acceleration or deceleration forces in any direction in the XY-plane may also be constructed by modifying any of the embodiments of FIGS. 3–12 into a substantially circular geometry. FIGS. 17*a* and 17*b* shows such an arrangement wherein the first part of the permanent magnet system comprises a permanent magnet 81 attached to the first part 10 of the first drive unit and a second part comprising a ferromagnetic part 82 attached to the second part 20 of the first drive unit. FIG. 17*b* shows a cross-section in the XY-plane along the line A–A' indicated in FIG. 17a. Both the permanent magnet 81 and the ferromagnetic part 82 have a substantially cylindrical shape, whereby the permanent magnet 81 encloses the ferromagnetic part 82.

In such an arrangement, an attractive force exist between the permanent magnet and the ferromagnetic part. For the symmetrical situation depicted in the FIGS. 17a and 17b, the force component in the XY-plane is zero, this position represents an unstable equilibrium with respect to displacements in the XY-plane. Similar arrangements can be constructed providing a stable equilibrium.

While specific embodiments of the invention have been described above, it will be appreciated that the invention may be practiced otherwise than as described. The description is not intended to limit the invention. The configuration, operation, and behavior of the present invention has been described with the understanding that modifications and variations of the embodiments are possible, given the level of detail present herein. For example, in the specific embodiments described above, the permanent magnet system is applied between the first part of the first drive unit and the second part of the first drive unit. Since one purpose of the permanent magnet system according to the present invention is to provide at least part of the required driving force between the object table and the first part of the second drive unit, it is clear that the permanent magnet system (or systems) can also be applied between the object table and the second part of the first drive unit or between the first part of the first drive unit and the first part of the second drive unit.

Thus, the preceding detailed description is not meant or intended to, in any way, limit the invention—rather the scope of the invention is defined by the appended claims.

What is claimed is:

1. A lithographic positioning device for positioning an object, comprising:
   a first drive unit for positioning the object in a first direction within a first operating range, said first drive unit comprising a first part and a second part, the first part being connected to said object and movable relative to the second part;
   a second drive unit for displacing said first drive unit in the first direction within a second operating range, said second drive unit comprising a first part connected to said second part of said first drive unit and movable relative to a second part of said second drive unit; and
   a permanent magnet system comprising a first part connected to either of said object or said first part of said first drive unit and a second part connected to either said second part of said first drive unit or said first part of said second drive unit,
   wherein said permanent magnet system is configured to generate a force for moving said object in the first direction, said force being a function of a relative position in the first direction of said object and said first part of said second drive unit.

2. A positioning device according to claim 1, wherein said force is substantially zero for a first position of said first part of said first drive unit relative to said second part in the first direction inside the first operating range of said first drive unit.

3. A positioning device according to claim 2, wherein said first position is in stable equilibrium.

4. A positioning device according to claim 2, wherein said first position is in an unstable equilibrium.

5. A positioning device according to claim 4, wherein a first derivative of the function with respect to the first direction is substantially zero for said first position.

6. A positioning device according to claim 2, further comprising:
   a first coil unit, associated with said first drive, that generates a force between said first part and said second part of said first drive unit; and
   a second coil unit, associated with said second drive, that generates a force between said first part and said second part of said second drive unit; and
   a control unit configured to control the positioning device in accordance with an acceleration/deceleration state and a constant velocity state,
      wherein, under said acceleration/deceleration state, an acceleration or deceleration of said object along the first direction is achieved by controlling a current of said first and second coil units, and
      wherein, under said constant velocity state, a substantially constant velocity of said object is achieved by controlling the current of said first and second coil units and substantially maintaining said permanent magnet system in said first position.

7. A positioning device according to claim 1, wherein said first part of said permanent magnet system comprises a first permanent magnet and said second part comprises a ferromagnetic part.

8. A positioning device according to claim 1, wherein said first part of said permanent magnet system comprises a first permanent magnet and said second part comprises a second permanent magnet.

9. A positioning device according to claim 1, wherein said permanent magnet system is further configured to generate a force in a second direction between said object and said first part of said second drive unit, said second direction being substantially perpendicular to said first direction.

10. A lithographic apparatus, comprising:
    an illumination system configured to provide a beam of radiation;
    a support structure configured to support a patterning device that imparts said beam of radiation with a desired pattern in its cross-section;
    a substrate holder configured to hold a substrate; and
    a projection system for projecting said patterned beam onto a target portion of said substrate; and
    a positioning device configured to position said support structure, said positioning device comprising:
       a first drive unit for positioning said support structure in a first direction within a first operating range, said first drive unit comprising a first part and a second part, the first part being connected to said support structure and movable relative to the second part;
       a second drive unit for displacing said first drive unit in the first direction within a second operating range, said second drive unit comprising a first part connected to said second part of said first drive unit and movable relative to a second part of said second drive unit; and
       a permanent magnet system comprising a first part connected to either of said support structure or said first part of said first drive unit and a second part connected to either said second part of said first drive unit or said first part of said second drive unit,
       wherein said permanent magnet system is configured to generate a force for moving said support structure in the first direction, said force being a function of a relative position in the first direction of said support structure and said first part of said second drive unit.

11. A lithographic apparatus according to claim 10, wherein said force is substantially zero for a first position of said first part of said first drive unit relative to said second part in the first direction inside the first operating range of said first drive unit.

12. A lithographic apparatus according to claim 11, wherein said first position is in stable equilibrium.

13. A lithographic apparatus according to claim 11, wherein said first position is in an unstable equilibrium.

14. A lithographic apparatus according to claim 13, wherein a first derivative of the function with respect to the first direction is substantially zero for said first position.

15. A lithographic apparatus according to claim 11, further comprising:
   a first coil unit, associated with said first drive, that generates a force between said first part and said second part of said first drive unit; and
   a second coil unit, associated with said second drive, that generates a force between said first part and said second part of said second drive unit; and
   a control unit configured to control the positioning device in accordance with an acceleration/deceleration state and a constant velocity state,
      wherein, under said acceleration/deceleration state, an acceleration or deceleration of said support structure along the first direction is achieved by controlling a current of said first and second coil units, and
      wherein, under said constant velocity state, a substantially constant velocity of said support structure is achieved by controlling the current of said first and second coil units and substantially maintaining said permanent magnet system in said first position.

16. A lithographic apparatus according to claim 10, wherein said first part of said permanent magnet system comprises a first permanent magnet and said second part comprises a ferromagnetic part.

17. A lithographic apparatus according to claim 10, wherein said first part of said permanent magnet system comprises a first permanent magnet and said second part comprises a second permanent magnet.

18. A lithographic apparatus according to claim 10, wherein said permanent magnet system is further configured to generate a force in a second direction between said support structure and said first part of said second drive unit, said second direction being substantially perpendicular to said first direction.

19. A lithographic apparatus, comprising:
   an illumination system configured to provide a beam of radiation;
   a support structure configured to support a patterning device that imparts said beam of radiation with a desired pattern in its cross-section;
   a substrate holder configured to hold a substrate; and
   a projection system for projecting said patterned beam onto a target portion of said substrate; and
   a positioning device configured to position said substrate holder, said positioning device comprising:
      a first drive unit for positioning said substrate holder in a first direction within a first operating range, said first drive unit comprising a first part and a second part, the first part being connected to said substrate holder and movable relative to the second part;
      a second drive unit for displacing said first drive unit in the first direction within a second operating range, said second drive unit comprising a first part connected to said second part of said first drive unit and movable relative to a second part of said second drive unit; and
      a permanent magnet system comprising a first part connected to either of said substrate holder or said first part of said first drive unit and a second part connected to either said second part of said first drive unit or said first part of said second drive unit,
         wherein said permanent magnet system is configured to generate a force for moving said substrate holder in the first direction, said force being a function of a relative position in the first direction of said substrate holder and said first part of said second drive unit.

20. A lithographic apparatus according to claim 19, wherein said force is substantially zero for a first position of said first part of said first drive unit relative to said second part in the first direction inside the first operating range of said first drive unit.

21. A lithographic apparatus according to claim 20, wherein said first position is in stable equilibrium.

22. A lithographic apparatus according to claim 20, wherein said first position is in an unstable equilibrium.

23. A lithographic apparatus according to claim 22, wherein a first derivative of the function with respect to the first direction is substantially zero for said first position.

24. A lithographic apparatus according to claim 20, further comprising:
   a first coil unit, associated with said first drive, that generates a force between said first part and said second part of said first drive unit; and
   a second coil unit, associated with said second drive, that generates a force between said first part and said second part of said second drive unit; and
   a control unit configured to control the positioning device in accordance with an acceleration/deceleration state and a constant velocity state,
      wherein, under said acceleration/deceleration state, an acceleration or deceleration of said substrate holder along the first direction is achieved by controlling a current of said first and second coil units, and
      wherein, under said constant velocity state, a substantially constant velocity of said substrate holder is achieved by controlling the current of said first and second coil units and substantially maintaining said permanent magnet system in said first position.

25. A lithographic apparatus according to claim 20, wherein said first part of said permanent magnet system comprises a first permanent magnet and said second part comprises a ferromagnetic part.

26. A lithographic apparatus according to claim 20, wherein said first part of said permanent magnet system comprises a first permanent magnet and said second part comprises a second permanent magnet.

27. A lithographic apparatus according to claim 19, wherein said permanent magnet system is further configured to generate a force in a second direction between said substrate holder and said first part of said second drive unit, said second direction being substantially perpendicular to said first direction.

28. A device manufacturing method, comprising:
   providing a substrate held by a substrate holder;
   providing a beam of radiation using an illumination system;
   imparting a desired pattern onto said beam of radiation by a patterning device supported by a support structure;
   projecting said patterned beam of radiation onto a target portion of said substrate via a projection system; and
   positioning said support structure via a positioning device by:

positioning said support structure in a first direction within a first operating range through a first drive unit, said first drive unit comprising a first part and a second part in which said first part is connected to said support structure and movable relative to said second part;

displacing said first drive unit in the first direction within a second operating range through a second drive unit, said second drive unit comprising a first part connected to said second part of said first drive unit and movable relative to a second part of said second drive unit; and generating a force for moving said support structure in the first direction through a permanent magnet system, said permanent magnet system comprising a first part connected to either of said support structure or said first part of said first drive unit and a second part connected to either said second part of said first drive unit or said first part of said second drive unit, wherein said force is a function of a relative position in the first direction of said support structure and said first part of said second drive unit.

29. A device manufacturing method, comprising:

providing a substrate held by a substrate holder;

providing a beam of radiation using an illumination system;

imparting a desired pattern onto said beam of radiation by a patterning device supported by a support structure;

projecting said patterned beam of radiation onto a target portion of said substrate via a projection system; and positioning said substrate holder via a positioning device by:

positioning said substrate holder in a first direction within a first operating range through a first drive unit, said first drive unit comprising a first part and a second part in which said first part is connected to said substrate holder and movable relative to said second part;

displacing said first drive unit in the first direction within a second operating range through a second drive unit, said second drive unit comprising a first part connected to said second part of said first drive unit and movable relative to a second part of said second drive unit; and generating a force for moving said substrate holder in the first direction through a permanent magnet system, said permanent magnet system comprising a first part connected to either of said substrate holder or said first part of said first drive unit and a second part connected to either said second part of said first drive unit or said first part of said second drive unit, wherein said force is a function of a relative position in the first direction of said substrate holder and said first part of said second drive unit.

* * * * *